United States Patent [19]

Kyle

[11] Patent Number: 4,654,752

[45] Date of Patent: Mar. 31, 1987

[54] TERMINAL ASSEMBLY AND METHOD OF MAKING TERMINAL ASSEMBLY

[76] Inventor: James C. Kyle, 2547 Fisher Rd., Roseburg, Oreg. 97470

[21] Appl. No.: 677,976

[22] Filed: Dec. 4, 1984

[51] Int. Cl.$^4$ .............................................. H05K 3/32
[52] U.S. Cl. ..................................... 361/386; 29/840
[58] Field of Search .................. 29/840, 832; 361/386, 361/387, 388, 389, 400, 401, 402, 403, 404, 405, 406, 407, 408; 174/68.5; 357/81

[56] References Cited

U.S. PATENT DOCUMENTS 4,113,981  9/1978  Fujita et al. ................. 174/94 R X

FOREIGN PATENT DOCUMENTS 981797  1/1976  Canada ............................ 174/68.5

Primary Examiner—A. D. Pellinen
Assistant Examiner—Morris Ginsburg
Attorney, Agent, or Firm—Ellsworth R. Roston; Charles H. Schwartz

[57] ABSTRACT

A first insulating member has electrical terminals and may constitute a semi-conductor chip. A second insulating member made from a first insulating material may constitute a heat sink for the semi-conductor chip. Electrical leads may extend through the second insulating member to the periphery of the member. A mound formed from a mixture of electrically conductive particles and electrically insulating particles is disposed between the first and second members. The electrically conductive particles may have sizes to a few hundred microns. When the first and second members are pressed toward each other, the electrically conductive particles migrate toward one another to establish an electrical path to the electrical terminals on the first member and establish electrical continuity between the electrical leads and the electrical terminals. At the same time, the electrically insulating particles tend to at least partially envelope the electrically conductive particles. The electrically insulating particles are heated to fuse the particles and to establish a hermetic seal between the fused particles, the first and second members and the electrically conductive particles.

31 Claims, 6 Drawing Figures

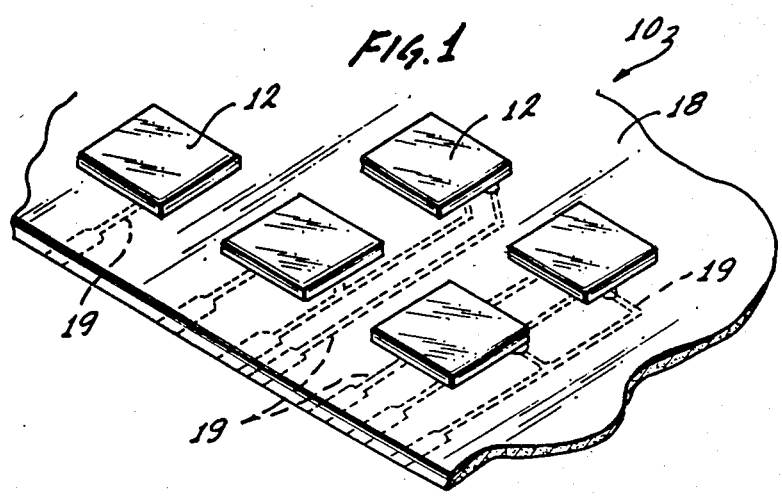
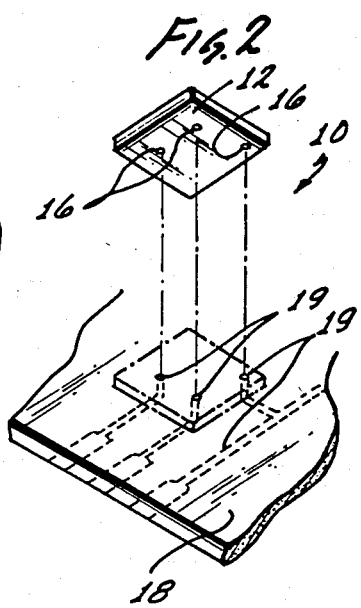
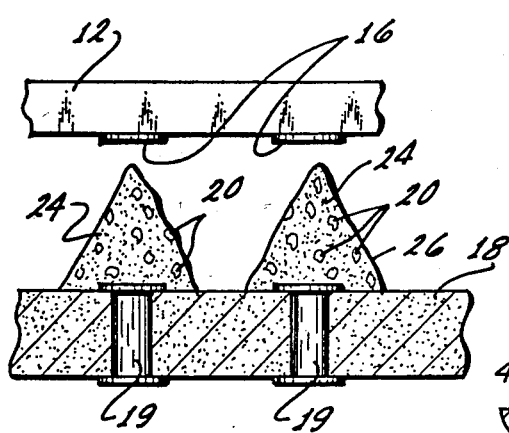
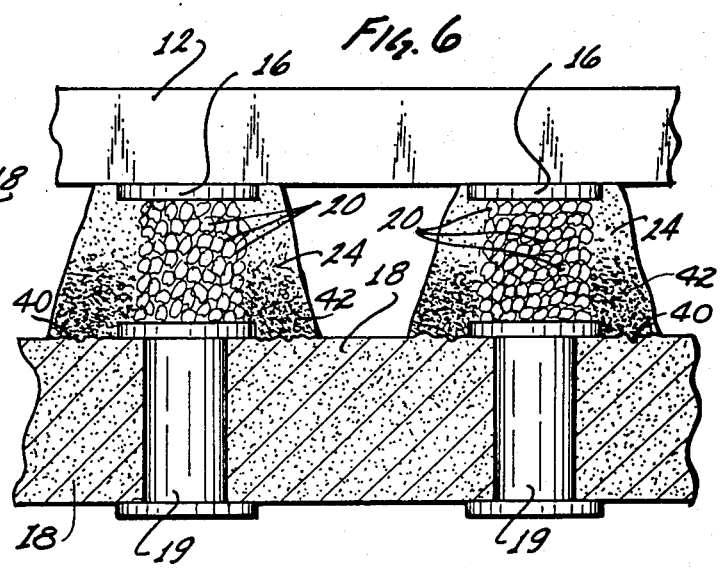
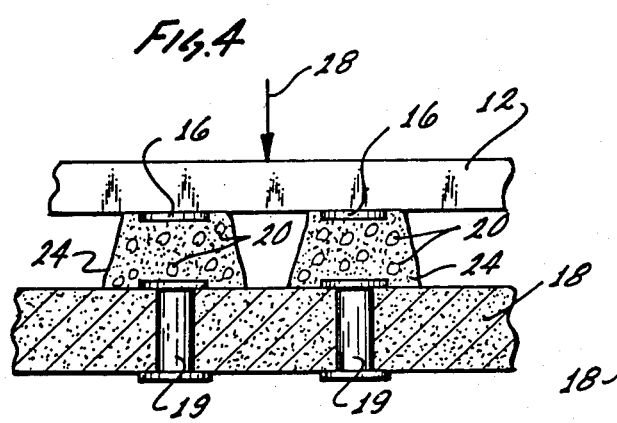
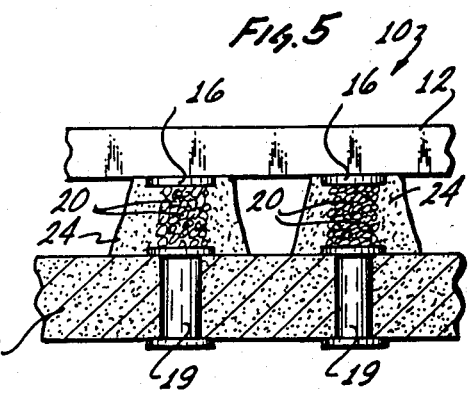

TERMINAL ASSEMBLY AND METHOD OF MAKING TERMINAL ASSEMBLY

This invention relates to electrical assemblies and more particularly relates to electrical assemblies for establishing electrical connections to electrical terminals in the assemblies without damaging the assemblies. The invention is particularly adapted to provide electrical connections to electrical terminals in semi-conductor chips.

As semi-conductor technology becomes advanced, the size of semi-conductor chips becomes reduced. For example, thousands of semi-conductor elements can now be produced on a semi-conductor chip which has an area of one tenth inch square (0.1"×0.1"). Even as the size of the chips has become progressively reduced, the techniques of manufacturing the chips have become advanced. The chips of relatively small size (0.1"×0.1") can now be produced with high rates of acceptance. As a result, millions, and even billions, of chips are being produced annually and are being sold at a relatively low price.

Although the technology of manufacturing semi-conductor chips has become considerably advanced, the techniques of assembling the chips into packages are still relatively antiquated. One proof of this is that the rates of acceptance of the chips, after the assembly of the chips into packages, are still relatively low. This results from the fact that an uncommonly high percentage of the chips becomes damaged when the chips become assembled into packages.

In view of the high volume of chips being manufactured and sold, a considerable effort has been made for a relatively long period of time, and substantial sums of money have been expended in that time, to overcome the problems discussed above. In spite of such efforts, the problems still persist. Semiconductor chips are still being damaged at an inordinately high rate as they are assembled into packages.

In one embodiment of the invention, a first insulating member has electrical terminals and may constitute a semi-conductor chip. A second insulating member made from a first insulating material may constitute a heat sink for the semi-conductor chip. Electrical leads may extend through the second insulating member to the periphery of the member. A mound formed from a mixture of electrically conductive particles and electrically insulating particles is disposed between the first and second members. The electrically conductive particles may have sizes to a few hundred microns.

When the first and second members are pressed toward each other, the electrically conductive particles migrate toward one another to establish an electrical path to the electrical terminals on the first member. At the same time, the electrically insulating particles tend to at least partially envelope the electrically conductive particles. The electrically insulating particles are heated to fuse the particles and to establish a hermetic seal between the fused particles, the first and second members and the electrically conductive particles.

In the drawings:

FIG. 1 is a perspective view of a semi-conductor assembly constituting one embodiment of the invention;

FIG. 2 is an enlarged exploded perspective view of individual elements in the assembly of FIG. 1 in an initial stage of forming the assembly;

FIG. 3 is an enlarged fragmentary sectional view of the assembly at an intermediate stage of forming the assembly;

FIG. 4 is an enlarged fragmentary sectional view, similar to that shown in FIG. 3, of the assembly at an advanced stage of forming the assembly;

FIG. 5 is an enlarged fragmentary sectional view similar to that shown in FIGS. 3 and 4, of the assembly at a final stage of forming the assembly; and FIG. 6 is an enlarged fragmentary sectional view of the assembly shown in FIGS. 1 through 5 and illustrates certain additional features of the assemply.

In one embodiment of the invention, an electrical assembly generally indicated at 10 and including a semi-conductor chip 12 is provided. The semi-conductor chip 12 is made from electrically insulating material such as silicon and is provided with electrical terminals 16 on the chip. An insulating member 18 made from a suitable material such as alumina is disposed in spaced relationship to the semi-conductor chip 12. The insulating member 18 may constitute a heat sink to conduct heat from the semi-conductor chip 12. Electrical leads 19 extend through the insulating member 18 to the surface of the member adjacent the semi-conductor chip 12.

Electrically conducting particles 20 made from a suitable material such as aluminum engage the electrical terminals 16 on the chip 12. The electrically conducting particles 20 may be made from any suitable material such as copper, aluminum, titanium or a noble metal such as gold or platinum. The electrically conducting particles 20 preferably constitute a mixture of particles of different sizes. Preferably the particles 20 have sizes between approximately one (1) micron and one hundred (100) microns. However, the particles 20 may have sizes to a few hundred microns or even higher. The electrical leads 19 extend through the insulating member 18 and establish electrical continuity with the electrically conducting particles 20. In this way, the particles 20 establish an electrical continuity between the leads 19 and the terminals 16.

Insulating material 24 at least partially envelopes the electrically conducting particles 20. The insulating material 24 is hermetically sealed to the semi-conductor chip 12, the insulating member 18 and the electrically conducting particles 20. The insulating material 24 maintains a desired spacing between the semi-conductor chip 12 and the insulating member 18.

The insulating member 24 may be initially formed from particles which are mixed with the electrically conducting particles 20. The particles of such insulating material 24 may have a size approximating those of the electrically conducting particles 20 or they may have an increased size. Preferably the particles defining the insulating material have a size less than approximately twelve hundred (1200) mesh.

The mixture of the electrically conductive particles 20 and the particles of the insulating material 24 are disposed in a mound on one of the semi-conductor chip 12 and the insulating member 18. FIG. 3 shows a mound 26 of such particles on the insulating member 18. The semi-conductor chip 12 and the insulating member 18 are then pressed toward each other to compress the mound. This is indicated by an arror 28 in FIG. 4. This causes the electrically conductive particles 20 to migrate toward each other to define a concentrated relationship as shown in FIGS. 5 and 6 and to define a continuous path between the electrical terminals 16 on the semi-conductor chip 12 and the insulating member 18. As a result, an electrical continuity is established between the electrical terminals 16 on the semi-conductor chip 12 and the leads 19. The insulating material 24 is then fused to define the hermetic seal between the semi-conductor chip 12, the insulating member 18 and the electrically conducting particles 20 and to establish the spacing between the chip 12 and the member 18.

As will be seen, electrical continuity is established between the electrical terminals 16 on the semi-conductor chip 12 and the electrically conductive particles 20 without having to provide any soldering or other forms of attachment by the use of localized heat such as in the prior art. This localized heat has tended to damage the semi-conductor chips 12. As a result, no damage is produced in the chip assemblies of this invention when electrical continuity is established between the electrical terminals 16 on the semi-conductor chip 12 and the electrical leads 19.

At the same time that the electrically conductive particles 20 are migrating to establish a conductive path between the electrical terminals 16 on the semi-conductor chip 12 and the electrical leads 19, the particles of insulating material 24 are also being consolidated in space to establish the spacing between the chip 12 and the member 18. This consolidation of the insulating material 24 tends to occur around the concentration of the electrically conductive particles 20. This spacing is then maintained when the insulating material 24 is fused to the chip 12, the member 18 and the electrically conductive particles as by heat.

The insulating material 24 may be formed from a material such as disclosed and claimed in application Ser. No. 589,418 filed by me on Mar. 14, 1984, now abandoned. The material 24 may be formed from two (2) compositions which are respectively designated as Fluxes A and B. The Flux A material may have the following materials in the following amounts by weight:

| Material | Relative Amounts By Weight |
| --- | --- |
| Lead oxide | 370 |
| Silicon oxide | 241 |
| Lithium carbonate | 51 |
| Sodium carbonate | 144 |
| Potassium carbonate | 111 |
| Titanium oxide | 83 |

The materials specified above constitute the preferred embodiment for Flux A. However, the amounts of the different materials specified above can be varied by approximately ten percent (10%) above or below the preferred amounts without departing from the scope of the invention.

Flux A may be prepared by initially mixing particles of the different materials specified above in the desired relative amounts. The mixture may then be heated to a suitable temperature such as approximately 800° F. and the temperature may be maintained at approximately 800° F. for a suitable period of time such as approximately one (1) hour. The temperature of the mixture may then be slowly increased to a temperature of approximately 1300° F. The mixture should melt at a temperature of approximately 1100° F. At any rate, the mixture is preferably heated to a temperature approximately 200° F. above the melting temperature of the mixture for a suitable period of time such as approximately two (2) hours.

At approximately every fifteen (15) minutes during the heating of the mixture, the mixture is preferably stirred slowly to insure that the different components in the mixture are being thoroughly mixed. The mixing of these components is facilitated by the release of carbon dioxide from such components as lithium carbonate, sodium carbonate and potassium carbonate.

After the mixture has been heated as described above, it is quenched in water. The smelted mixture tends to frit when quenched so that particles of the quenched mixture are formed. Only particles of a small size such as 1200 mesh and smaller are selected. Apparatus for selecting such small particles is well known in the art.

The lead oxide and silicon oxide in Flux A constitute standard components in a glass former. The sodium provided by the sodium carbonate tends to limit the mobility of Flux A. The lithium tends to increase the coefficient of thermal expansion of Flux A. The lithium also acts as a nucleotide in forming polycrystalline structures. Lithium is also a mild glass former.

The potassium in Flux A constitutes a glass former and tends to balance the alkali properties of the insulating material. It also enhances the amorphous characteristics of Flux A. It is further advantageous because it tends to enhance the properties of high electrical resistivity of Flux A.

The titanium in Flux A acts as nucleotides to obtain the formation of polycrystals in the insulating material. These crystals have different sizes and shapes. The resultant combination of crystals of different sizes and shapes throughout Flux A insures that optimal bonds will be provided from the insulating material 24 to the chip 12 and the member 18 and that these bonds survive temperature and mechanical stresses in the electrical assembly 10.

The Flux B composition may be made from glass formers such as lead oxide, boric oxide and silicon dioxide. This mixture may constitute a flux and may have a melting temperature of approximately 800° F. The composition of the material in Flux B may be as set forth below:

| Material | Relative Percentage By Weight |
| --- | --- |
| Lead oxide | 68.5 |
| Boric oxide | 10.5 |
| Silicon dioxide | 21.0 |

The formulation and method of smelting the material constituting the Flux B composition are disclosed in detail in copending application Ser. No. 229,151 filed by me on Jan. 28, 1981 (now U.S. Pat. No. 4,421,947).

To form the Flux B material, the flux specified above may be smelted for a suitable period of time such as approximately two (2) hours at a suitable temperature such as approximately 1500° F. and may then be quenched in water.

The Flux A and Flux B materials may then be mixed in a suitable ratio such as approximately twenty-four percent (24%) by weight of the Flux B material and approximately seventy-six percent (76%) by weight of the Flux A material. The mixture may then be mixed with the electrically conducting particles 20 and may be disposed in the form of the mound 26 in the space between the chip 12 and the member 18 as described above. The chip 12 and the member 18 may then be pressed toward each other as indicated by the arrow 28 to separate the electrically conductive particles as indicated in FIG. 5.

The sub-assembly may then be fired at a suitable temperature such as approximately 950° F. for a suitable period of time such as a few seconds to a period of a few minutes. The sub-assembly may then be cooled as in air. Although the firing is preferably in a primarily inert atmosphere, it may occur in an atmosphere which is entirely air or in an atmosphere which is entirely an inert gas such as argon.

Instead of separately smelting the Flux A material and the Flux B material as described above, the Flux A and Flux B materials may be first mixed and then smelted as a mixture. The smelting preferably occurs at a temperature of approximately 200° F. above the melting temperature of the mixture. This melting temperature may approach 1300° F. The smelting should be preferably provided in the same manner as described above for only the Flux B material. The material is then quenched in water, formed into particles and mixed with the electrically conducting particles 20. The resultant mixture is then disposed in the mound 26 between the members 12 and 18 and fired at a suitable temperature such as approximately 1050° F. The resultant material 24 has the advantages described above for the material 24 which is produced when the Flux A and Flux B materials are separately smelted.

Instead of using the Flux B material described above, another Flux B material may be used. This Flux B material may have a smelting temperature of approximately 1000° F. and a composition as follows:

| Material | Relative Percentage by Weight |
|---|---|
| Lead oxide | 80.0 |
| Boric oxide | 20.0 |

This Flux B material may be smelted for a suitable period of time such as approximately one (1) hour at a suitable temperature such as approximately 1200° F. and then quenched in water. The composition and formation of the Flux B material including only the lead oxide and the boric oxide are described in detail in copending application Ser. No. 229,151 filed by me on Jan. 28, 1981 (now U.S. Pat. No. 4,421,947).

The Flux A material and the Flux B material (comprising only lead oxide and boric oxide) may be mixed in approximately the same ratio as described above and then mixed with the electrically conductive particles 20. The resultant mixture may then be formed into mounds between the chip 12 and the insulating member 18. The assembly may then be compressed as described above. The resultant electrical assembly may then be fired at a suitable temperature such as approximately 1050° F.

The resultant assembly has substantially the properties and advantages described above for the sub-assembly when the Flux B material is made, as described above, from flux formers which also include silicon dioxide. However, the maximum operating temperature of the insulating material 24 is approximately 650° F. when the Flux B material comprises only lead oxide and boric oxide.

As will be appreciated, the Flux B material including only lead oxide and boric oxide may be mixed with the other Flux B material described above and smelted as a mixture in a manner similar essentially to that described above for the Flux B material when the Flux B material comprises only lead oxide and boric oxide. The smelting mixture may be quenched in water, formed into particles and mixed with the electrically conducting particles 20. The resultant mixture may then be disposed in a mound in the space between the chip 12 and the insulating member 18. The assembly formed by the chip 12, the member 18, the electrically conducting particles 20 and the insulating material 24 may be fired in the manner described in the previous paragraph. The resultant sub-assembly has the properties and advantages essentially as described in the previous paragraph.

The flux formers (both designated above as Flux B materials) may be smelted separately and then may be mixed or they may be mixed and then smelted. The mixture of the two (2) flux formers with the Flux A material may be in the ratio of approximately twenty-four percent (24%) of the flux formers and approximately seventy-six percent (76%) of the Flux A material. The two (2) flux formers may be included in the ratio of approximately fifteen (15) to twenty-five (25) parts by weight of the flux former including silicon dioxide and forty (40) to fifty-five (55) parts by weight of the flux former comprising only lead oxide and boric oxide.

Application Ser. No. 229,151 (now U.S. Pat. No. 4,421,947) also discloses in detail the composition and method of forming a crystalline stuffing. This crystalline stuffing may also be used as a Flux B material in combination with either or both of the Flux B materials described above. The crystalline stuffing may be formed from the following materials in the following percentages by weight:

| Material | Relative Parts By Weight |
|---|---|
| Antimonate | 2 |
| Zinc zirconium silicate | 1 |
| Zirconium spinel | 1 |
| Zirconium silicate | 1 |

The crystalline stuffing may be smelted for a suitable period of time such as approximately three (3) hours at a suitable temperature such as approximately 1800° F. and may then be quenched in water. The crystalline stuffing constituting the Flux B material and the Flux A material then may then be mixed to form a mixture of particles and this mixture may then be mixed with the electrically conducting particles 20. The resultant mixture may then be disposed between the chip 12 and the electrically insulating member 18 and fired at a suitable temperature such as approximately 1800° F. for a relatively short period of time such as a few seconds to a few minutes. The terminal assembly may then be cooled as described above. The resultant terminal assembly has all of the advantages and properties described above except that it provides hermetic seals to temperatures as high as approximately 1400° F.

The Flux B material may also be formed from a combination of the two (2) flux formers and the crystalline stuffing. These materials may be smelted separately as described above or may be mixed and then smelted as a mixture or they may be mixed with the Flux A material and then smelted. The two (2) flux formers may be mixed in the ratio specified above. The crystalline stuffing may be included in the Flux B material in the ratio of approximately twenty (20) parts to forty-five (45) parts of crystalline stuffing and fifty-five (55) to eighty (80) parts of the two (2) flux formers.

The insulating material 24 and the insulating member 18 have a common boundary 40, as shown in FIG. 6. This boundary is free of any oxides of the material of the chip 12 and the member 20 since the bonding occurs primarily in an inert atmosphere. The insulating material 24 and the insulating member 18 also have a bonding area 42 which extends from this common boundary 40 through a particular distance into the insulating material 24 as schematically illustrated in FIG. 6. A mixture of the insulating material 24 and the material of the insulating member 18 is disposed in this bonding area. The amount of the material of the insulating member 18 in the bonding area 42 increases progressively with progressive distances from the common boundary 40.

The material of the insulating member 18 in the bonding area 42 tends to receive oxygen from the insulating material 24 during the firing operation. This tends to produce a mechanical and chemical bond between the insulating material 24 and the material of the insulating member 18 in the bonding area 42.

The thickness of the bonding area 42 is dependent upon certain parameters. For example, the thickness of the bonding area 42 is dependent upon the atmosphere in which the insulating member 18 and the insulating material 24 are fired. The thickness of the bonding area 42 is relatively small when the insulating member 18 and the insulating material 24 are fired in an inert atmosphere such as argon. This thickness may be illustratively 0.005". When the atmosphere is approximately fifteen percent (15%) air and eighty-five (85%) argon, the thickness of the bonding area 42 may be illustratively 0.015". The thickness of the bonding area 42 may be illustratively 0.060"–0.80" when the atmosphere is entirely air. The thickness of the bonding area 42 is also dependent upon the period of time during which the electrical assembly is fired. As will be appreciated, the thickness of the bonding area 42 increases with increases in the time during which the insulating member 18 and the insulating material 24 are fired.

The production of the bonding area 42 and the composition of the bonding area provide certain important advantages. One advantage is that the insulating member 18 is progressively bonded throughout the bonding area 42 to the insulating material 24 from a mechanical and chemical standpoint. This insures that a hermetic seal is produced between the insulating material 24 and the insulating member 18.

The bonding area 42 also offers other advantages. For example, it provides a progressive transition between the coefficient of thermal expansion of the member 18 and the coefficient of thermal expansion of the insulating material 24. This assures that the hermetic seal between the insulating material 24 and the insulating member 18 will be maintained throughout an extended range of temperatures as high as 900° F.

The insulating material 24 provides a hermetic seal with the insulating member 18 for pressures as high as approximately 10,000 psi and for temperatures as high as approximately 900° F. It even provides this hermetic seal to materials such as copper and copper alloys at such temperatures and pressures.

The insulating material 24 has other advantages in addition to those described above. For example, the insulating material 24 is so effective that it can be used with a considerably reduced thickness in comparison to the insulating materials of the prior art while still retaining the advantages described above. Because of this, the thickness of the the insulating member 18 can be increased without any increase in the dimensions of the assembly 10. This causes the effectiveness of the insulating member 18 as a heat sink to be enhanced.

The assembly 10 disclosed above has certain important advantages. It provides an assembly which is hermetically sealed. This prevents the atmosphere from invading the interior of the assembly. It also provides for an efficient and reliable attachment of the integrated circuit chip 12 to the heat sink provided by the insulating member 18. It also provides for a high electrical insulation between the integrated circuit chip 12 and the insulating member 18 through the medium of the insulating material 24. This electrical insulation is maintained through a wide range of temperatures.

The assembly 10 is also advantageous because it has good heat conductivity. This prevents heat from accumulating at any localized position to destroy the effectiveness of the integrated circuit chip 12. The good heat conductivity of the assembly 10 results in part from the use of metals with good heat conducting properties as the materials of the terminals 16 on the semi-conductor chip 12, the electrical leads 19 and the electrically conductive particles 20. It also results from the fact that the insulating member 18 and the insulating material 24 also have good properties of conducting heat. For example, the heat conductivity of the insulating material 24 appears to be at least five (5) times greater than that of beryllium oxide or aluminum oxide.

The assembly 10 disclosed above also has other important advantages. It can be made simply and reliably to provide the advantages discussed above. The method of manufacture of the assembly 10 assures that the assembly can be hermetically sealed without damaging the integrated circuit chip 12. The method of manufacture also insures that the integrated circuit chip 12 can be attached to the insulating member 18 to establish an electrical continuity between the electrical leads 19 and the electrical terminals 16 on the semi-conductor chip 12 and still maintain an electrically insulating relationship between the semi-conductor chip 12 and the electrically insulating member 18.

Although this application has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. In combination,
   a first insulating member having at least one electrical terminal on the member,
   a second insulating member spaced from the first insulating member, the second insulating member having at least one electrical terminal on the member,
   a plurality of electrically conductive particles disposed between the first and second members in a concentrated relationship and establishing an electrical contact with the electrical terminals on the first and second insulating members and with one another, and
   an insulating material hermetically sealed to the first and second electrically insulating members and the plurality of electrically conductive particles.

2. A combination as set forth in claim 1 wherein the electrically conductive particles are of micron size.

3. A combination as set forth in claim 2 wherein the electrically conductive particles vary in size to a few hundred microns.

4. A combination as set forth in claim 2 wherein the insulating material envelopes the electrically conductive particles in the space between the first and second insulating members.

5. A combination as set forth in claim 4 wherein the first insulating member is a semi-conductor chip and the second insulating member constitutes a heat sink.

6. In combination as set forth in claim 1 wherein an electrical lead extends through the second insulating member to the electrically conductive particles and establishes contact with the electrically conductive particles.

7. In combination,
a first insulating member having an electrical terminal on the member,
a second insulating member disposed in spaced relationship to the first insulating member,
particles of an electrically conductive material disposed in a compressed and concentrated relationship between the first and second members and establishing electrical continuity with one another and with the electrical terminal on the first member,
an electrical lead extending through the second member and establishing electrical continuity with the electrically conductive particles, and
electrically insulating material enveloping the electrically conductive particles between the first and second insulating members and fused to the electrically conductive particles and hermetically sealed to the first and second insulating members and the electrically conductive particles.

8. A combination as set forth in claim 7 wherein the electrically conductive particles have sizes to a few hundred microns.

9. A combination as set forth in claim 8 wherein the second insulating member is made from alumina.

10. A combination as set forth in claim 8 wherein the first member is a semi-conductor chip and the second member is a heat sink.

11. A combination as set forth in claim 10 wherein the electrically conductive particles are made from a material selected from the group consisting of aluminum, copper, titanium and a noble member and the second member is made from alumina.

12. A method of forming an electrical assembly, including the steps of:
providing a first electrically insulating member having an electrical terminal on the member,
providing a second electrically insulating member having an electrical terminal on the member,
providing a mound of particles from a mixture of electrically insulating particles and electrically conductive particles,
disposing the mixture in a mound between the first and second insulating members,
pressing the first and second insulating members toward one another to obtain a migration of the electrically conductive particles toward one another to define a concentrated relationship of the electrically conductive particles and the establishment of an electrical path between the electrical terminal on the first insulating member and the electrical terminal on the second insulating member through the electrically conductive particles with electrically conductive particles in contact with one another, and
heating the first and second members and the electrically conductive particles and electrically insulating particles to fuse the electrically insulating particles and to establish a hermetic seal between the fused electrically insulating particles and the electrically conductive particles and between the electrically insulating particles and the first and second insulating members.

13. A method as set forth in claim 12, including the step of:
providing an electrical lead through the second member to the electrically conductive particles which define the conductive path, after the first and second electrically insulating members have been pressed toward each other.

14. A method as set forth in claim 13 wherein the electrically conductive particles have sizes to a few hundred microns.

15. A method as set forth in claim 14 wherein the electrically conductive particles are made from a material selected from the group consisting of aluminum, copper, titanium and a noble metal and the second insulating member is made from alumina and the first electrically insulating member is a semi-conductor chip.

16. A method as set forth in claim 13 wherein the electrical lead is provided through the second member to the electrically conductive particles before the fusing of the electrically insulating particles.

17. A method as set forth in claim 12 wherein the first electrically insulating member is a semi-conductor chip and the second insulating member constitutes a heat sink.

18. A method as set forth in claim 12 wherein the electrically insulating particles migrate toward positions enveloping the concentration of the electrically conductive particles when the first and second insulating members are pressed toward each other.

19. A method of forming an electrical assembly, including the steps of:
providing a first insulating member having an electrically conductive terminal,
providing a second insulating member having an electrically conductive terminal,
disposing a mixture of electrically conductive particles and electrically insulating particles between the electrically conductive terminals on the first and second insulating members,
pressing the first insulating member toward the second insulating member to obtain a migration of the electrically conductive particles into a concentrated relationship and in contact with one another between the first and second electrically conductive members and to obtain a migration of the electrically insulating particles into an enveloping relationship with the electrically conductive particles, and
fusing the electrically insulating particles to the electrically conductive particles and to the first and second insulating members.

20. In a method as set forth in claim 19,
the fusion between the electrically insulating particles and the first insulating member at the boundary between the electrically insulating particles and the first insulating member being free of any oxide of the material of the first insulating member.

21. In a method as set forth in claim 20,
a combination of the electrically insulating particles and the material of the first insulating member being produced in a bonding area extending into the electrically insulating particles from the boundary between the electrically insulating particles and the first insulating member.

22. In a method as set forth in claim 21,
the electrically conductive particles having sizes to several hundred microns and the electrically insulating particles having sizes to several hundred microns.

23. In a method as set forth in claim 22,
the electrically conductive particles being made from a material selected from the group consisting of aluminum, copper, titanium and a noble member.

24. In a method as set forth in claim 23,
the first member being made from alumina.

25. In a method as set forth in claim 24,
the second member constituting an integrated circuit chip.

26. In combination,
a first insulating member having an electrically conductive terminal,
a second insulating member having an electrically conductive terminal, the second insulating member being disposed in spaced relationship to the first insulating member,
electrically conductive particles disposed in a concentrated relationship between the first and second insulating members in electrical contact with one another and with the terminals on the first and second insulating members, and
electrically insulating material enveloping the electrically conductive particles in fused relationship with the electrically conductive particles and the first and second insulating members.

27. In a combination as set forth in claim 26,
there being in the electrically insulating material, at positions adjacent to the first insulating member, a bonding area containing a mixture of the electrically insulating material and the material of the first insulating member.

28. In a combination as set forth in claim 27,
the second insulating member constituting an integrated circuit chip.

29. In a combination as set forth in claim 28,
the boundary between the electrically insulating material and the first insulating member being free of any oxide of the material of the first insulating member.

30. In a combination as set forth in claim 29,
the electrically conductive particles being made from a material selected from the group consisting of aluminum, copper, titanium nd a noble metal.

31. In a combination as set forth in claim 29,
the second electrically insulating member constituting a heat sink.

* * * * *